US009766289B2

(12) United States Patent
Parasrampuria et al.

(10) Patent No.: US 9,766,289 B2
(45) Date of Patent: Sep. 19, 2017

(54) LBIST DEBUG CONTROLLER

(71) Applicant: FREESCALE SEMICONDUCTOR, INC., Austin, TX (US)

(72) Inventors: Mayank Parasrampuria, Jaipur (IN); Anurag Jindal, Patiala (IN); Sagar Kataria, Noida (IN)

(73) Assignee: NXP USA, INC., Austin, TX (US)

( * ) Notice: Subject to any disclaimer, the term of this patent is extended or adjusted under 35 U.S.C. 154(b) by 150 days.

(21) Appl. No.: 14/875,717

(22) Filed: Oct. 6, 2015

(65) Prior Publication Data

US 2017/0097388 A1     Apr. 6, 2017

(51) Int. Cl.
*G01R 31/3183* (2006.01)
*G01R 31/3185* (2006.01)
*G01R 31/317* (2006.01)

(52) U.S. Cl.
CPC ........... *G01R 31/318385* (2013.01); *G01R 31/31705* (2013.01); *G01R 31/318547* (2013.01)

(58) Field of Classification Search
CPC ............ G01R 31/3177; G01R 31/31725
See application file for complete search history.

(56) References Cited

U.S. PATENT DOCUMENTS

| | | | |
|---|---|---|---|
| 7,644,333 B2 | 1/2010 | Hill | |
| 7,814,384 B2 | 10/2010 | Goessel et al. | |
| 7,958,417 B2 | 6/2011 | Chakraborty et al. | |
| 8,516,318 B2 * | 8/2013 | Douskey | G01B 31/318558 714/727 |
| 8,667,431 B1 | 3/2014 | Douskey et al. | |
| 2006/0117230 A1 * | 6/2006 | Scipioni | G01R 31/31937 714/701 |
| 2007/0234150 A1 * | 10/2007 | Jain | G01B 31/318544 714/726 |
| 2008/0215940 A1 * | 9/2008 | Burlison | G01R 31/318566 714/726 |
| 2009/0089636 A1 * | 4/2009 | Fernsler | G06F 11/2242 714/728 |
| 2012/0124440 A1 | 5/2012 | Gorti et al. | |

* cited by examiner

*Primary Examiner* — April Y Blair
*Assistant Examiner* — Rong Tang
(74) *Attorney, Agent, or Firm* — Charles E. Bergere

(57) ABSTRACT

An integrated circuit (IC) includes a logic built-in self-test (LBIST) system that includes scan chains. The scan chains receive a clock signal and test pattern signals, and generate scan out signals. A debug controller receives the scan out signals and shifts a set of the scan out signals to a joint test action group (JTAG) controller. The debug controller also maintains a dynamic count indicative of the number of debug shift operations performed, and compares the dynamic count with a final count. If the dynamic count is less than the final count, the debug controller performs a second debug shift operation, which facilitates determination of a fault location in the IC.

7 Claims, 5 Drawing Sheets

LBIST DEBUG CONTROLLER

BACKGROUND

The present invention relates generally to integrated circuits, and, more particularly, to a logic built-in self-test (LBIST) debug controller for an integrated circuit.

Integrated circuits (ICs) include various analog and digital components on a single chip. With advancements in semiconductor technology, more and more components are being added, which can make testing the components difficult and time consuming. Further, the number of I/O pins is limited by the overall size of the IC. Thus, many of today's ICs include internal logic provided specifically for testing the internal IC circuitry. This logic is known as logic built-in self-test (LBIST) circuitry.

An LBIST system typically is used to detect stuck-at-faults. An LBIST debug controller acts as an interface between the LBIST system and a tester, and facilitates in diagnosing any detected faults. The LBIST system includes a pseudo-random pattern generator (PRPG), scan chains, and a multiple-input shift register (MISR). The PRPG generates scan input signals. Each scan chain includes a set of flip-flops that is connected serially to the PRPG. Each scan chain receives corresponding scan input signal and generates a scan out signal. The MISR receives the scan out signals, compresses them, and generates a signature, which is compared to a signature stored in the tester. If the signatures do not match, the LBIST system determines that the IC contains a fault.

Although the LBIST system facilitates determination of whether or not the IC contains a fault, it does not help in detection of the location of the fault location. A manual fault analysis needs to be performed to locate the fault. Manual fault analysis is both difficult and time consuming. Further, this technique does not facilitate masking of faulty scan chains, and hence, does not provide an effective solution for testing ICs.

It would be advantageous to have an LBIST debug controller that facilitates determination of fault locations and can mask faulty scan chains.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
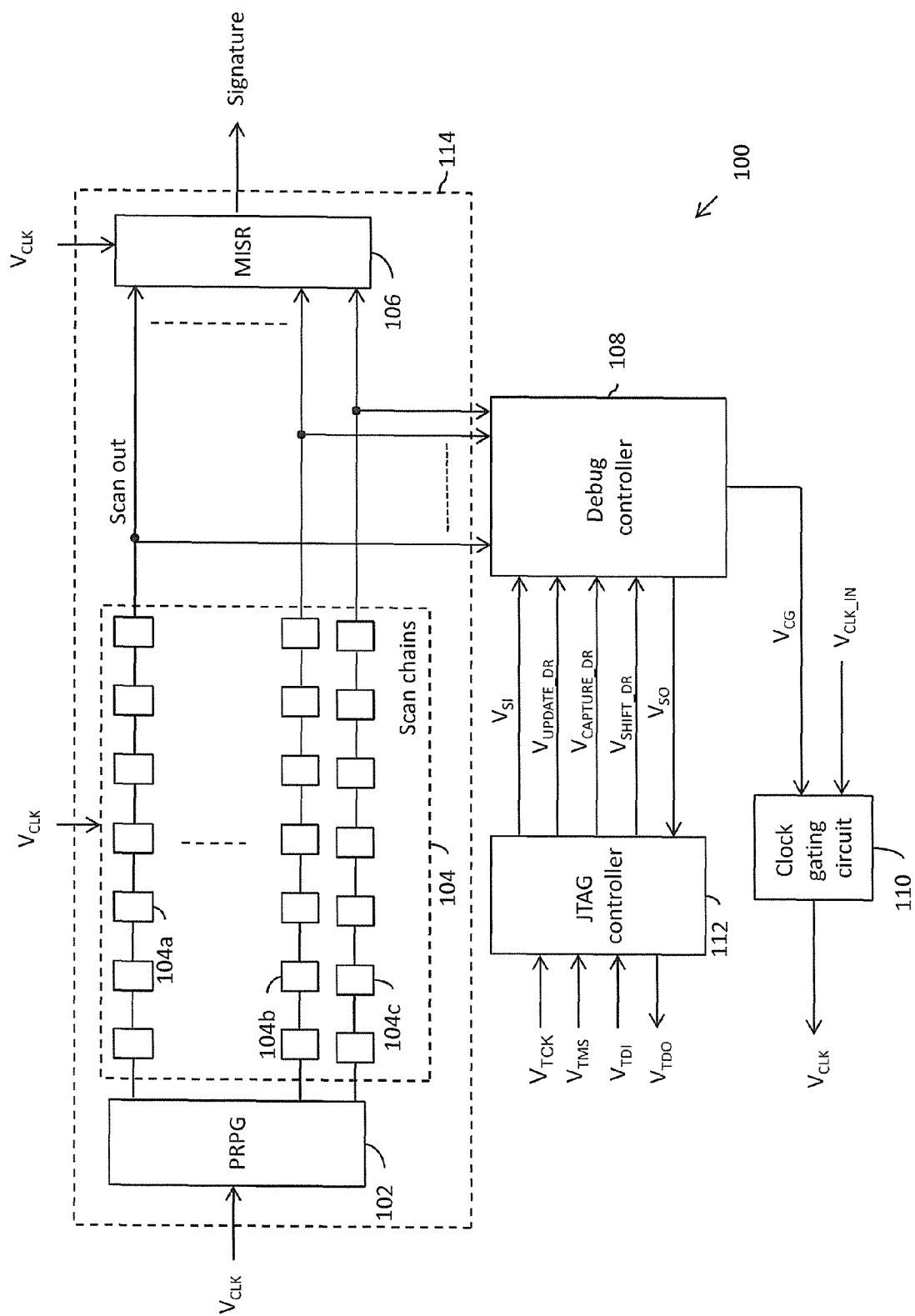
FIG. 1 is a schematic block diagram of an integrated circuit (IC) in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the term multiplexer has been abbreviated as a mux.

The present invention provides a LBIST debug controller that enables non-destructive reads of the state of the IC. The LBIST debug controller also enables scan chain masking.

In one embodiment of the present invention, an integrated circuit (IC) is provided. The IC includes a pseudo-random pattern generator (PRPG), a plurality of scan chains, and a debug controller. The PRPG receives a clock signal and generates a plurality of test pattern signals. The scan chains receive the clock signal and the test pattern signals and generate a plurality of scan out signals, where each scan out signal corresponds to one of the scan chains. The debug controller receives the scan out signals and performs a first set of debug shift operations. The debug controller generates a dynamic count value indicative of a total number of debug shift operations performed, compares the dynamic count value with a final count value, and performs a second set of debug shift operations if the dynamic count value is less than the final count value. When the dynamic count value equals the final count value, the debug controller activates or un-gates the clock signal.

In another embodiment of the present invention, a method performed by a debug controller connected to a logic built-in self-test (LBIST) system of an IC is provided. The LBIST system includes a plurality of scan chains for receiving a clock signal and generating a plurality of scan out signals. The method includes receiving the scan out signals and performing a first set of debug shift operations. The method further includes generating a dynamic count value that indicates the number of the first set of debug shift operations performed. The dynamic count value is compared with a final count value. The method further includes performing a second set of debug shift operations if the dynamic count value is less than the final count value, and activating the clock signal when the dynamic count value is equal to the final count value.

Various embodiments of the present invention provide an IC. The IC includes a PRPG, multiple scan chains and a debug controller. The PRPG and the scan chains constitute a logic built-in self-test (LBIST) system. The PRPG generates and provides test pattern signals to the scan chains. The scan chains generate corresponding scan out signals. The debug controller receives the scan out signals and performs a first set of debug shift operations. The debug controller generates a dynamic count value that is indicative of the number of debug shift operations of the first set of debug shift operations, compares the dynamic count value with a final count value, and performs a second set of debug shift operations if the dynamic count value is less than the final count value. When the dynamic count value equals the final count value, the debug controller activates or un-gates the clock signal.

The debug controller shifts the scan out signals as an output pattern to an external tester, which compares the output pattern with a predetermined output pattern. The debug controller facilitates determination of the fault location. The debug controller includes masking modules for masking faulty scan chains.

Referring now to FIG. 1, a schematic block diagram of an integrated circuit (IC) 100 in accordance with an embodiment of the present invention is shown. The IC 100 includes a pseudo-random pattern generator (PRPG) 102, a plurality of scan chains 104, a multiple-input shift register and compactor (MISR) 106 and a debug controller 108. The IC 100 also includes a clock gating circuit 110 and a joint action group (JTAG) controller 112. The PRPG 102, the scan chains 104 and the MISR 106 form a logic built-in self-test (LBIST) system 114.

The PRPG 102 is connected to the clock gating circuit 110 and receives a clock signal ($V_{CLK}$) and generates test pattern signals.

The scan chains 104, three of which are shown, include first through third scan chains 104a-104c. The scan chains 104 are connected to the clock gating circuit 110 and receive the clock signal. The scan chains 104 are also connected to the PRPG 102 and receive the test pattern signals and generate corresponding scan out signals from the respective scan chains 104a-104c. For example, the first scan chain 104a receives a first test pattern signal and generates a first scan out signal.

The MISR 106 is connected to the scan chains 104 and receives the scan out signals. The MISR 106 is also connected to the clock gating circuit 110 and receives the clock signal. The MISR 106 compresses the scan out signals to generate a signature and provides the signature to a tester (not shown).

The debug controller 108 is connected to the scan chains 104 and receives the scan out signals and generates a clock gating signal ($V_{CG}$) for activating (or de-activating) the clock signal. The debug controller 108 is also connected to the JTAG controller 112 and receives a shift-in signal ($V_{SI}$), an update data register signal ($V_{UPDATE\_DR}$), a capture data register signal ($V_{CAPTURE\_DR}$) and a shift data register signal ($V_{SHIFT\_DR}$), and outputs a shift out signal ($V_{SO}$).

Figure 2:
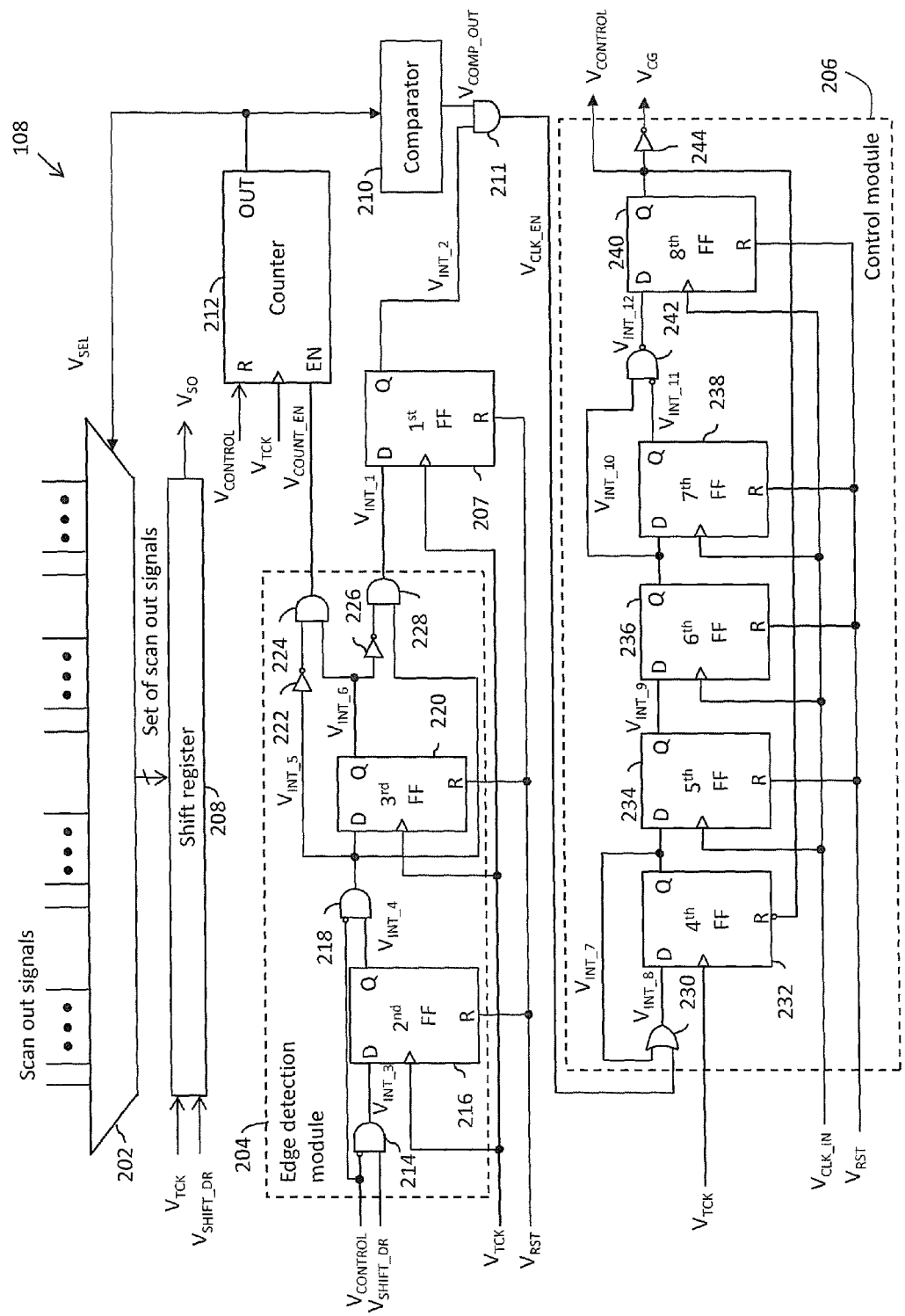
FIG. 2 is a schematic block diagram of a debug controller of the IC of FIG. 1 in accordance with an embodiment of the present invention.

The IC 100 is operable in scan shift, debug shift, scan capture, and debug capture modes. During the scan shift mode, test pattern signals are shifted into the scan chains 104. The JTAG controller 112 activates the shift data register signal ($V_{SHIFT\_DR}$) when the IC 100 is in the debug shift mode. During the debug shift mode, the scan out signals are shifted to the tester via a shift register 208 (FIG. 2). During the scan capture mode, a functional response of the IC 100 is captured in the scan chains 104. The JTAG controller 112 activates the capture data register signal ($V_{CAPTURE\_DR}$) when the IC 100 is in the debug capture mode. During the debug capture mode, a set of scan out signals are latched into the shift register 208.

The JTAG controller 112 also receives a test clock signal ($V_{TCK}$), a test mode select signal ($V_{TMS}$), and a test data input signal ($V_{TDI}$), and generates a test data output signal ($V_{TDO}$).

The clock gating circuit 110 is connected to the debug controller 108 and receives the clock gating signal ($V_{CG}$). The clock gating circuit 110 also receives a clock input signal ($V_{CLK\_IN}$) and provides the clock signal ($V_{CLK}$).

Referring now to FIG. 2, a schematic block diagram of the debug controller 108 in accordance with an embodiment of the present invention is shown. The debug controller 108 includes a mux 202, an edge detection module 204, a control module 206, a first flip-flop 207, a shift register 208, a comparator 210, a first AND gate 211, and a counter 212.

The mux 202 has is connected to the scan chains 104 and receives the scan out signals. The mux also has a select terminal that receives a select signal ($V_{SEL}$), and outputs a set of the scan out signals.

The shift register 208 is connected to the mux 202 and receives the set of scan out signals and provides a shift out signal. More particularly, the shift register 208 receives the set of scan out signals from the mux 202 in the debug capture mode to perform a debug capture operation. In one embodiment, the JTAG controller 112 is connected to the shift register 208 and receives the shift out signal ($V_{SO}$), which indicates shifting of the set of scan out signals serially from the shift register 208 to the JTAG controller 112. The shift register 208 performs a debug shift operation by shifting the set of scan out signals serially from the shift register 208 to the JTAG controller 112. The shift register 208 performs multiple debug shift operations and debug capture operations to shift the scan out signals serially from the shift register 208 to the JTAG controller 112.

The edge detection module 204 is connected to the JTAG controller 112 and receives the shift data register signal. In addition, the edge detection module 204 receives a control signal ($V_{CONTROL}$), the test clock signal ($V_{TCK}$), and a reset signal ($V_{RST}$), and generates a first intermediate signal ($V_{INT\_1}$) and a counter enable signal ($V_{COUNT\_EN}$). In the embodiment shown, a high reset signal ($V_{RST}$) indicates that the LBIST system 114 is enabled and the clock signal is active.

The first intermediate signal ($V_{INT\_1}$) indicates that the debug controller 108 is performing debug shift operations. During the debug shift operations, the clock signal is inactive (i.e., gated), and hence, the scan chains 104 are disabled. The first intermediate signal, on the other hand (i.e., in another state), also indicates that the scan chains 104 are shifting the scan out signals.

The first flip-flop 207 has an input terminal that is connected to the edge detection module 204 and receives the first intermediate signal, a clock terminal that receives the test clock signal, a reset terminal that receives the reset signal, and an output terminal that provides a second intermediate signal ($V_{INT\_2}$).

The edge detection module 204 includes a second AND gate 214, a second flip-flop 216, a third AND gate 218, a third flip-flop 220, a first inverter 222, a fourth AND gate 224, a second inverter 226, and a fifth AND gate 228. The second AND gate 214 receives an inverted version of the control signal (/$V_{CONTROL}$) and the shift data register signal ($V_{SHIFT\text{-}DR}$), and generates a third intermediate signal ($V_{INT\_3}$), which is provided to a data input terminal of the second flip-flop 216. The second flip-flop 216 also has a clock terminal that receives the test clock signal, a reset terminal that receives the reset signal, and an output terminal that provides a fourth intermediate signal ($V_{INT\_4}$).

The third AND gate 218 receives the inverted version of the control signal (/$V_{CONTROL}$), and the fourth intermediate signal, and generates a fifth intermediate signal ($V_{INT\_5}$), which is provided to a data input terminal of the third flip-flop 220. The third flip-flop 220 also has a clock terminal that receives the test clock signal, a reset terminal that receives the reset signal, and an output terminal that provides a sixth intermediate signal ($V_{INT\_6}$). The first inverter 222 receives the fifth intermediate signal and outputs an inverted version of the fifth intermediate signal. The fourth AND gate 224 receives the inverted version of the fifth intermediate signal and the sixth intermediate signal, and generates the counter enable signal ($V_{COUNT\_EN}$). The second inverter 226 also receives the sixth intermediate signal, and outputs an inverted version of the sixth intermediate signal. The fifth AND gate 228 receives the inverted version of the sixth intermediate signal and the fifth intermediate signal, and generates the first intermediate signal.

The counter 212 has an enable terminal connected to the output terminal of the fourth AND gate 224 and receives the counter enable signal ($V_{COUNT\_EN}$), a clock terminal that receives the test clock signal, a reset terminal that receives the reset signal, and an output terminal that provides the select signal. The select signal indicates a dynamic count value, which indicates the number of debug shift operations performed by the shift register 208.

The comparator 210 receives the dynamic count value (i.e., $V_{SEL}$). The comparator 210 holds a final count value indicative of the total number of debug shift operations that need to be performed by the shift register 208 in order to output the scan out signals to the JTAG controller 112. The comparator 210 compares the dynamic count value with the stored, final count value, and generates a comparator output signal $V_{COMP\_OUT}$.

The first AND gate 211 has a first input terminal that is connected to the comparator 210 and receives the comparator output signal, a second input terminal that is connected to the output terminal of the first flip-flop 207 and receives the second intermediate signal, and an output terminal that provides a clock enable signal ($V_{CLK\_EN}$). The clock enable signal indicates activating (i.e., gating and un-gating) of the clock signal.

The control module 206 receives the clock input signal ($V_{CLK\_IN}$), the test clock signal ($V_{TCK}$) and the reset signal ($V_{RST}$) and generates the clock gating signal ($V_{CG}$) and the control signal ($V_{CONTROL}$). The control module 206 includes a first OR gate 230, fourth through eighth flip-flops 232-240, a NAND gate 242, and a third inverter 244.

The clock enable signal ($V_{CLK\_EN}$) and a seventh intermediate signal ($V_{INT\_7}$) are input to the first OR gate, and an eighth intermediate signal ($V_{INT\_8}$) is output therefrom. The fourth flip-flop 232 has a data input terminal that receives the eighth intermediate signal, a clock terminal that receives the test clock signal, a reset terminal that receives an inverted version of the control signal, and an output terminal that provides the seventh intermediate signal.

The fifth through eighth flip-flops 234-240 each have a clock terminal that receives the clock input signal (($V_{CLK\_IN}$) and a reset terminal that receives the reset signal (($V_{RST}$). Then, the fifth flip-flop 234 receives the seventh intermediate signal at its data input terminal and provides a ninth intermediate signal (($V_{INT\_9}$) at its output terminal. The sixth flip-flop 236 receives the ninth intermediate signal at its data input terminal and provides the tenth intermediate signal ($V_{INT\_10}$) at its output terminal. The seventh flip-flop 238 receives the tenth intermediate signal at its data input and provides an eleventh intermediate signal ($V_{INT\_11}$) at its output terminal. The NAND gate 242 receives the tenth and eleventh input signals and generates a twelfth intermediate signal ($V_{INT\_12}$). The eighth flip-flop 240 receives the twelfth intermediate signal at its data input terminal and outputs the control signal ($V_{CONTROL}$). The control signal ($V_{CONTROL}$) is input to the third inverter 244 and the third inverter outputs the clock gating signal ($V_{CG}$).

Figure 3:
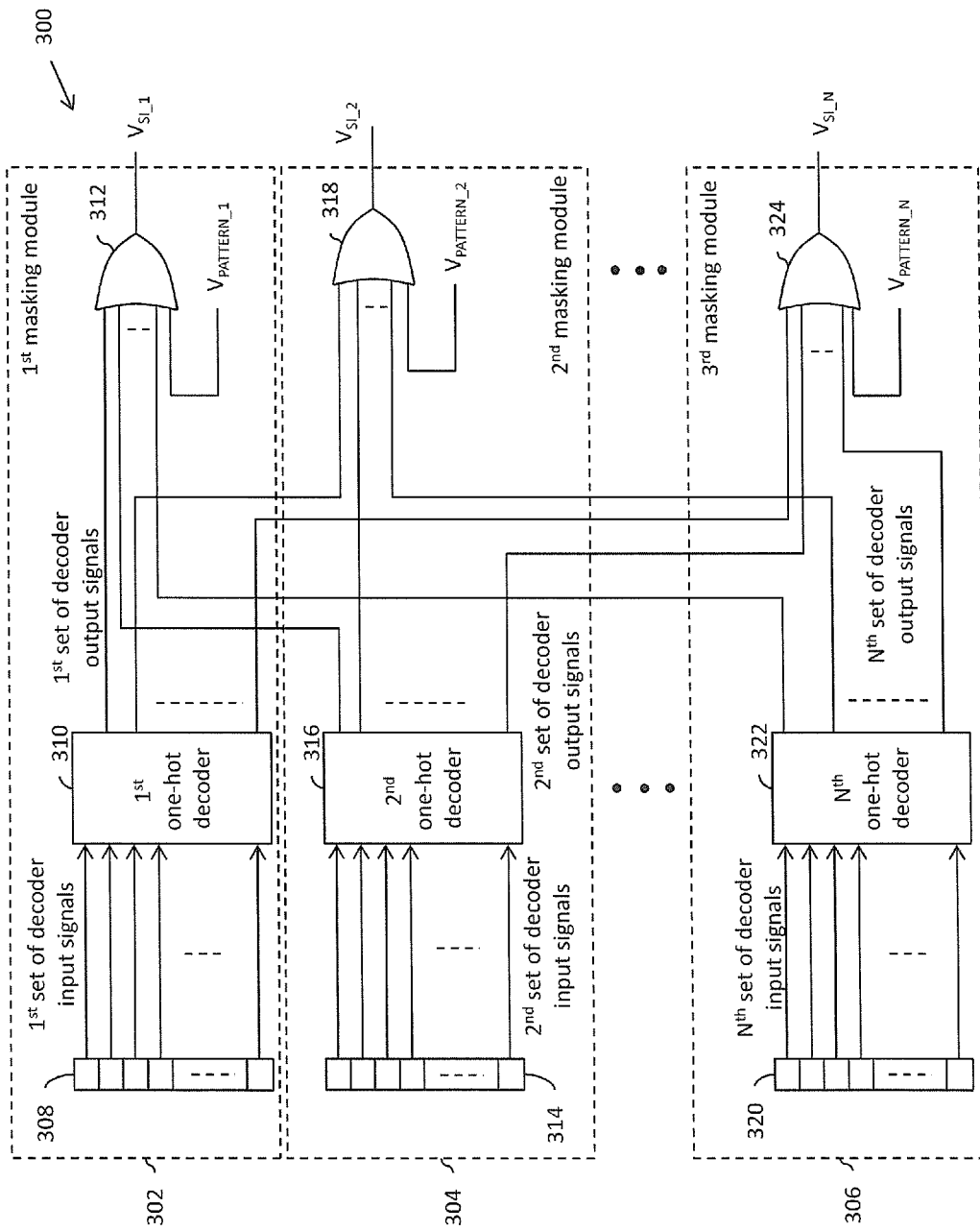
FIG. 3 is a schematic block diagram of a plurality of masking modules in accordance with an embodiment of the present invention.

Referring now to FIG. 3, a schematic block diagram of a plurality of masking modules 300, three of which are shown, in accordance with an embodiment of the present invention is shown. The masking modules 300 shown are first through third masking modules 302-306. In one embodiment, the masking modules 300 are part of the debug controller 108.

Each of the masking modules 302-308 comprises a debug register—respectively first, second and third debug registers 308, 314 and 320, a one-hot decoder—respectively first, second and third one-hot decoders 310, 316 and 322, and an OR gate—respectively second, third and fourth OR gates 312, 318 and 324.

The first debug register 308 stores a first mask value and provides a first set of decoder input signals including a first decoder input signal. The first mask value includes a plurality of bits corresponding to the scan chains 104, where each bit indicates whether the corresponding scan chain 104 is masked or not. Similarly, the second debug register 314 stores a second mask value and provides a second set of decoder input signals including a second decoder input signal, and the third debug register 320 stores a third mask value and provides a third set of decoder input signals including a third decoder input signal.

The first one-hot decoder 310 is connected to the first debug register 308 and receives the first set of decoder input signals, and generates a first set of decoder output signals including first through third decoder output signals. Each decoder output signal indicates whether the corresponding scan chain 104 is masked or not. Similarly, the second one-hot decoder 316 receives the second set of decoder input signals and generates a second set of decoder output signals including fourth through sixth decoder output signals. The third one-hot decoder 322 receives the third set of decoder input signals and generates a third set of decoder output signals including seventh through ninth decoder output signal. A one-hot decoder is a combinational block that converts a binary code to a one-hot code, i.e., each binary input combination has a corresponding unique output signal that is activated, which in this case means goes high. In a one-hot code, a bit corresponding to the binary code is high and the rest of the bits are low.

The second OR gate 312 receives the first, fourth and seventh decoder output signals and the first test pattern signal ($V_{PATTERN\_1}$) from the PRPG 102, and generates a first scan input signal ($V_{SI\_1}$). The first scan input signal indicates whether or not the first scan chain 104a is masked. Similarly, the third OR gate 318 receives the second, fifth and eighth decoder output signals and a second test pattern signal ($V_{PATTERN\_2}$) from the PRPG 102, and generates a second scan input signal ($V_{SI\_2}$). The fourth OR gate 324 is connected to the first through third one-hot decoders 310, 316 and 322 and the PRPG 102 and receives the third, sixth and ninth decoder output signals and a third test pattern signal ($V_{PATTREN\_3}$), respectively, and generates a third scan input signal ($V_{SI\_3}$).

In the presently preferred embodiment, the masking modules 300 are all structurally and functionally similar to each other.

Figure 4:
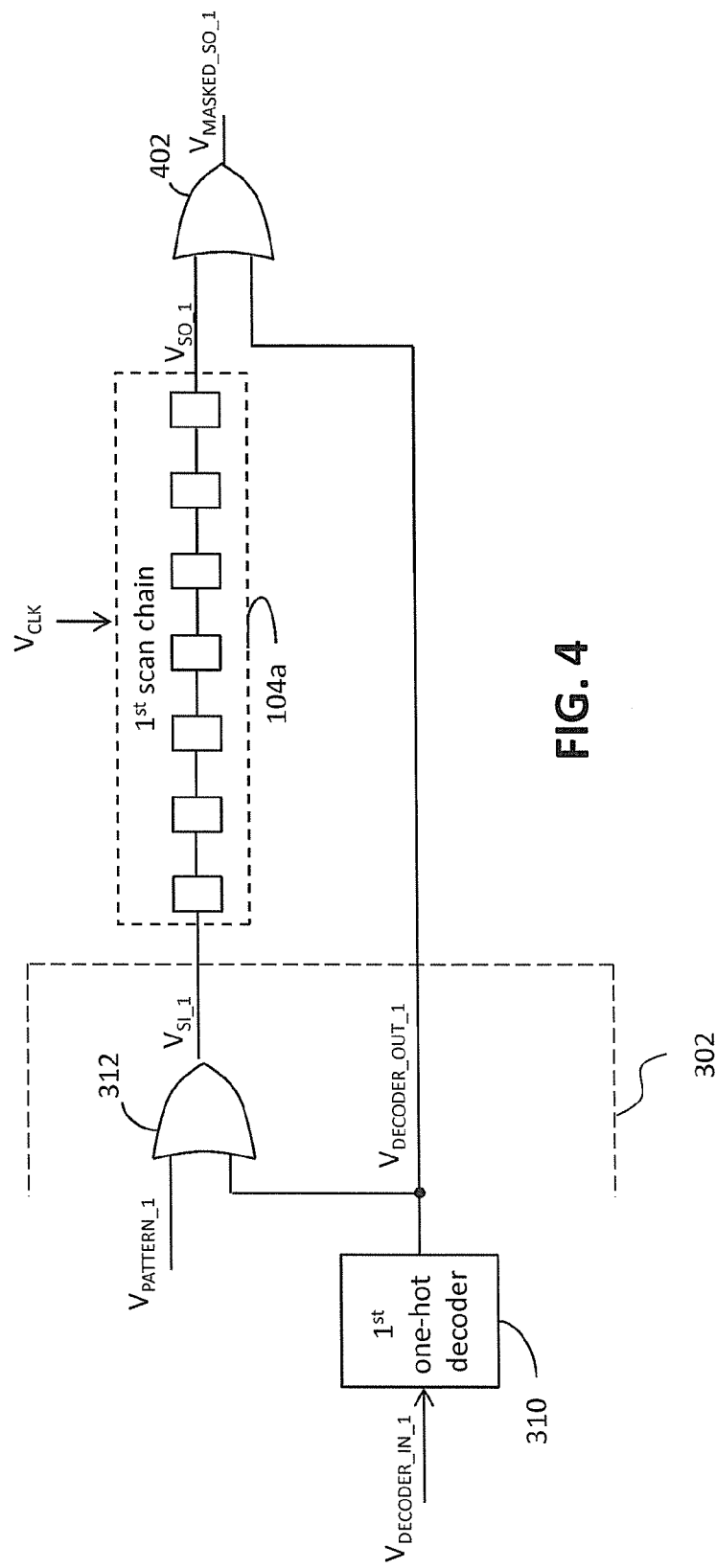
FIG. 4 is a schematic block diagram of a masking module in accordance with an embodiment of the present invention.

Referring now to FIG. 4, a schematic block diagram of the first masking module 302 connected to the first scan chain 104a in accordance with an embodiment of the present invention is shown. The first scan chain 104a is connected to the output of the second OR gate 312 and receives the first scan input signal ($V_{SI\_1}$). The first scan chain 104a also receives the clock signal, and generates the first scan out signal ($V_{SO\_1}$). The first scan chain 104a is connected to a fifth OR gate 402, which receives the first scan out signal ($V_{SO\_1}$) and the first one-hot decoder output signal ($V_{DECODER\_Out\_1}$), and generates a first masked scan out signal ($V_{MASKED\_SO\_1}$). The first masked scan out signal indicates whether or not the first scan chain 104a is masked.

Thus, the masking module 300 generates multiple masked scan out signals. In one embodiment, the mux 202 is connected to the masking modules 300 and receives the masked scan out signals as the scan out signals. Hence, the masking modules 300 are used to facilitate masking of faulty scan chains.

In operation, the PRPG 102 generates test pattern signals. The scan chains 104 generate scan out signals and provide the scan out signals to the mux 202, which outputs the selected set of scan out signals to the shift register 208

(based on the select signal). The shift register 208 outputs the set of scan out signals serially to the JTAG controller 112. The counter 212 then generates the dynamic count value. The comparator 210 compares the dynamic count value with the final count value and generates the comparator output signal. The control module 206 deactivates the clock gating signal when the comparator output signal is activate. When the dynamic count value equals the final count value, the control module 206 deactivates the clock gating signal, which in turn activates the clock signal. The JTAG controller 112 receives the scan out signals serially and transmits the scan out signals serially as the output pattern to the tester.

The tester compares the output pattern with a predetermined output pattern to determine whether the IC 100 is contains a fault. If the IC 100 contains a fault, the tester identifies which scan chain 104 detected the fault and where in the scan chain the fault is located. The masking modules 300 allow for masking of faulty scan chains (scan chains that contain a fault), which can aid in debugging and diagnosis of faults within the IC 100.

Figure 5:
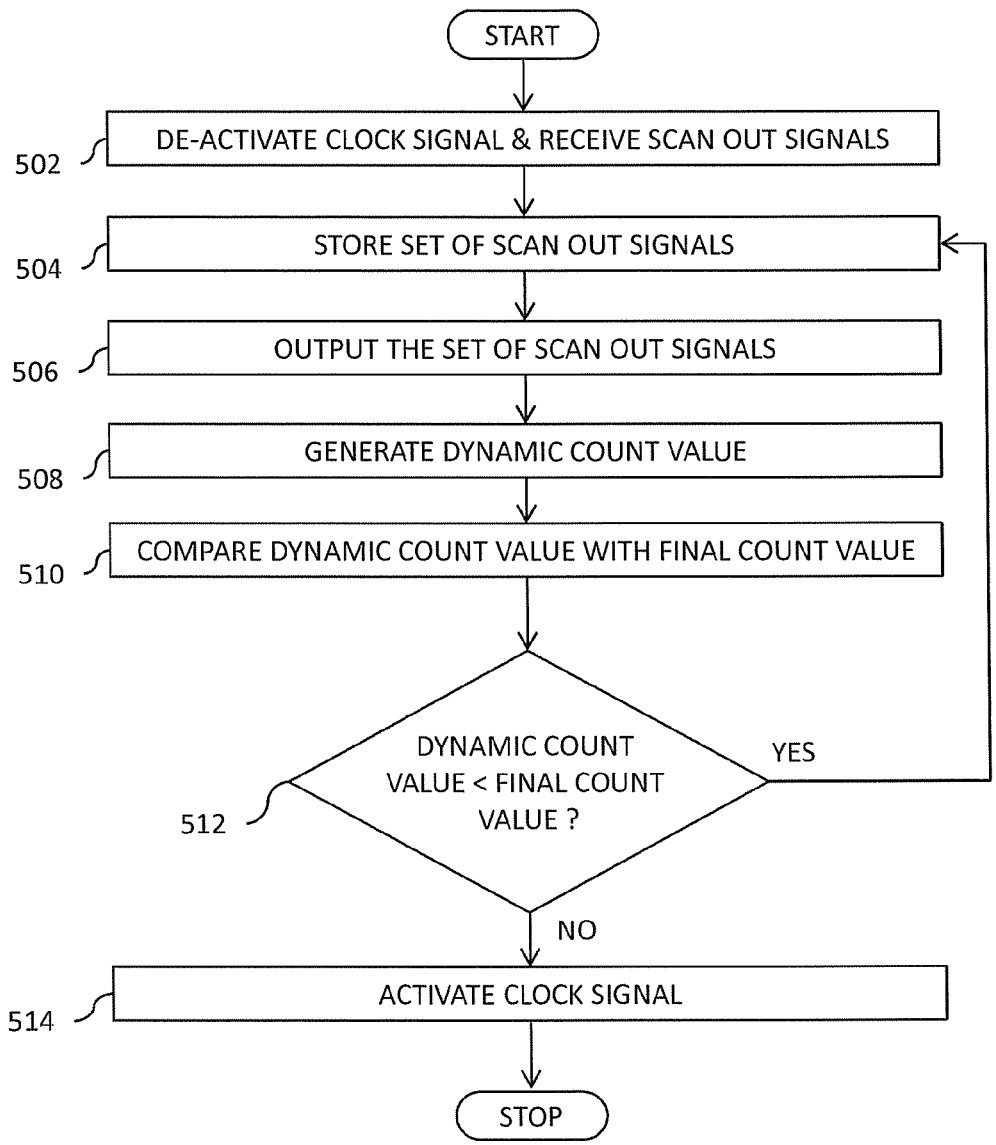
FIG. 5 is a flow chart illustrating a method performed by the debug controller of FIG. 2 in accordance with an embodiment of the present invention.

Referring now to FIG. 5, a flow chart illustrating a method performed by the debug controller 108 in accordance with an embodiment of the present invention is shown. The method begins with step 502, where the debug controller 108 deactivates the clock signal (i.e., gates the clock signal) and receives the scan out signals. At step 504, the debug controller 108 stores a set of scan out signals in the shift register 208. At step 506, the debug controller 108 outputs the set of scan out signals serially to the JTAG controller 112. At step 508, the debug controller 108 generates the dynamic count value. At step 510, the debug controller 108 compares the dynamic count value with the final count value. At step 512, the debug controller 108 checks to determine whether the dynamic count value is less than the final count value. If at step 512 the debug controller 108 determines that the dynamic count value is less than the final count value, the debug controller 108 loops back to step 504. If at step 512 the debug controller 108 determines that the dynamic count value is greater than or equal to the final count value, the debug controller 108 proceeds to step 514. At step 514, the debug controller 108 activates the clock signal (i.e., un-gates the clock signal).

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims. Further, the phrase "based on" is intended to mean "based, at least in part, on" unless explicitly stated otherwise.

The invention claimed is:

1. An integrated circuit, comprising:
a pseudo-random pattern generator (PRPG) that receives a clock signal and generates a plurality of test patterns;
a plurality of scan chains that receive the clock signal, and respective ones of the test patterns, and generate a plurality of scan out signals, wherein each scan out signal corresponds to one of the scan chains; and
a debug controller, connected to the scan chains, that (i) receives the scan out signals, (ii) performs a first set of debug shift operations, (iii) generates a dynamic count value that indicates a total number of first set of debug shift operations, (iv) compares the dynamic count value with a final count value, (v) performs a second set of debug shift operations when the dynamic count value is less than the final count value, and (vi) activates the clock signal when the dynamic count value is greater than or equal to the final count value, wherein the debug controller further receives a shift data register signal, a test clock signal, a reset signal, and a clock input signal, and wherein the debug controller comprises:
a multiplexer having input terminals connected to the plurality of scan chains for receiving the scan out signals, a select input that receives the dynamic count value, and output terminals that output a selected set of the scan out signals;
a shift register that receives the test clock signal and the shift data register signal, and is connected to the output terminals of the multiplexer for receiving the selected set of scan out signals, and outputs the selected set of scan out signals;
a counter having a reset terminal that receives a control signal, a clock terminal that receives the test clock signal, an enable terminal that receives a counter enable signal, and an output terminal that generates the dynamic count value;
a comparator connected to the counter for receiving and comparing the dynamic count value with the final count value, and generating a comparator output signal;
an edge detection module that receives the control signal, the shift data register signal, the test clock signal, and the reset signal, and generates the counter enable signal and a first intermediate signal;
a first flip-flop having an input terminal connected to the edge detection module for receiving the first intermediate signal, a clock terminal that receives the test clock signal, a reset terminal that receives the reset signal, and an output terminal that provides a second intermediate signal;
a first logic gate that receives the comparator output signal and the second intermediate signal, and generates a clock enable signal for activating the clock signal; and
a control module that receives the test clock signal, the clock input signal, the reset signal and the clock enable signal, and generates a clock gating signal for activating the clock signal, and wherein the control module comprises:
a first OR gate that receives the clock enable signal and a seventh intermediate signal, and generates an eighth intermediate signal;
a fourth flip-flop having a data input terminal that receives the eighth intermediate signal, a clock terminal that receives the test clock signal, a reset terminal that receives an inverted version of the control signal, and an output terminal that provides the seventh intermediate signal;
a fifth flip-flop having a data input terminal that receives the seventh intermediate signal, a clock terminal that receives the clock input signal, a reset terminal that receives the reset signal, and an output terminal that provides a ninth intermediate signal;
a sixth flip-flop having a data input terminal that receives the ninth intermediate signal, a clock terminal that receives the clock input signal, a reset terminal that receives the reset signal, and an output terminal that provides a tenth intermediate signal;

a seventh flip-flop having a data input terminal that receives the tenth intermediate signal, a clock terminal that receives the clock input signal, a reset terminal that receives the reset signal, and an output terminal that provides an eleventh intermediate signal;

a first NAND gate that receives the tenth intermediate signal and an inverted version of the eleventh input signal, and generates a twelfth intermediate signal;

an eighth flip-flop having a data input terminal that receives the twelfth intermediate signal, a clock terminal that receives the clock input signal, a reset terminal that receives the reset signal, and an output terminal that provides the control signal; and an inverter that receives the control signal and outputs the clock gating signal.

2. The integrated circuit of claim 1, wherein each debug shift operation of the first and second sets of debug shift operations corresponds to storing of a set of the scan out signals and serially outputting said set of scan out signals.

3. The integrated circuit of claim 1, wherein the final count value is indicative of a total number of debug shift operations performed by the debug controller.

4. The integrated circuit of claim 1, wherein the edge detection module comprises:

a second AND gate that receives an inverted version of the control signal and the shift data register signal, and generates a third intermediate signal;

a second flip-flop having a data input terminal that receives the third intermediate signal, a clock terminal that receives the test clock signal, a reset terminal that receives the reset signal, and an output terminal that provides a fourth intermediate signal;

a third AND gate that receives the inverted version of the control signal and the fourth intermediate signal, and generates a fifth intermediate signal;

a third flip-flop having a data input terminal that receives the fifth intermediate signal, a clock terminal that receives the test clock signal, a reset terminal that receives the reset signal, and an output terminal that provides a sixth intermediate signal;

a fourth AND gate that receives an inverted version of the fifth intermediate signal and the sixth intermediate signal, and generates the counter enable signal; and a fifth AND that receives an inverted version of the sixth intermediate signal and the fifth intermediate signal, and generates the first intermediate signal.

5. The integrated circuit of claim 1, wherein the debug controller includes a plurality of masking modules connected to the PRPG for receiving the plurality of test patterns, and generating a plurality of masked scan out signals.

6. The integrated circuit of claim 5, wherein the plurality of masking modules includes a first masking module that comprises:

a debug register that stores a mask value and outputs a decoder input signal based on the mask value, wherein the mask value is indicative of masking a first scan chain of the plurality of scan chains;

a one-hot decoder connected to the debug register that receives the decoder input signal, and generates a decoder output signal indicative of masking or unmasking the first scan chain;

a second OR gate having a first input terminal that receives a first test pattern of the plurality of test patterns, a second input terminal connected to the one-hot decoder for receiving the decoder output signal, and an output terminal that provides a scan input signal to the first scan chain; and a third OR gate having a first input terminal connected to the first scan chain that receives a first scan out signal of the plurality of scan out signals, a second input terminal connected to the one-hot decoder for receiving the decoder output signal, and an output terminal that provides a first masked scan out signal of the plurality of masked scan out signals, wherein the first masked scan out signal is at a first logic state when the first scan chain is masked and at a second logic state when the first scan chain is unmasked.

7. The integrated circuit of claim 6, wherein the masked scan out signals are provided as the plurality of scan out signals.

* * * * *